United States Patent [19]

Cooper

[11] Patent Number: 5,642,112
[45] Date of Patent: Jun. 24, 1997

[54] METHOD AND APPARATUS FOR PERFORMING LZW DATA COMPRESSION UTILIZING AN ASSOCIATIVE MEMORY

[75] Inventor: Albert B. Cooper, New York City, N.Y.

[73] Assignee: Unisys Corporation, Blue Bell, Pa.

[21] Appl. No.: 366,356

[22] Filed: Dec. 29, 1994

[51] Int. Cl.$^6$ ............................................. H03M 7/30
[52] U.S. Cl. ............................................. 341/51; 341/106
[58] Field of Search ............................ 341/51, 106, 50

[56] References Cited

U.S. PATENT DOCUMENTS

| | | | |
|---|---|---|---|
| 5,373,290 | 12/1994 | Lempel et al. | 341/51 |
| 5,455,576 | 10/1995 | Clark, II et al. | 341/50 |
| 5,469,161 | 11/1995 | Bezek | 341/51 |
| 5,485,526 | 1/1996 | Tobin | 382/232 |

*Primary Examiner*—Jeffrey A. Gaffin
*Assistant Examiner*—Jason L. W. Kost
*Attorney, Agent, or Firm*—Albert B. Cooper; Mark T. Starr

[57] ABSTRACT

An associative memory is utilized to perform LZW data compression. The respective locations of the memory contain a prefix code field and a character field. A register containing a code field and a character field is associatively compared to the locations of the memory to determine if a match exists therewith. If a match is found, the address of the match is inserted in the code field of the register and the next input character is inserted in the character field thereof. This process is continued until no match occurs. The code existing in the code field of the register is transmitted as the compressed code of the string and the contents of the register is written into the next empty location of the memory. A next cycle is initiated by nulling the code field of the register and repeating the described steps.

20 Claims, 2 Drawing Sheets

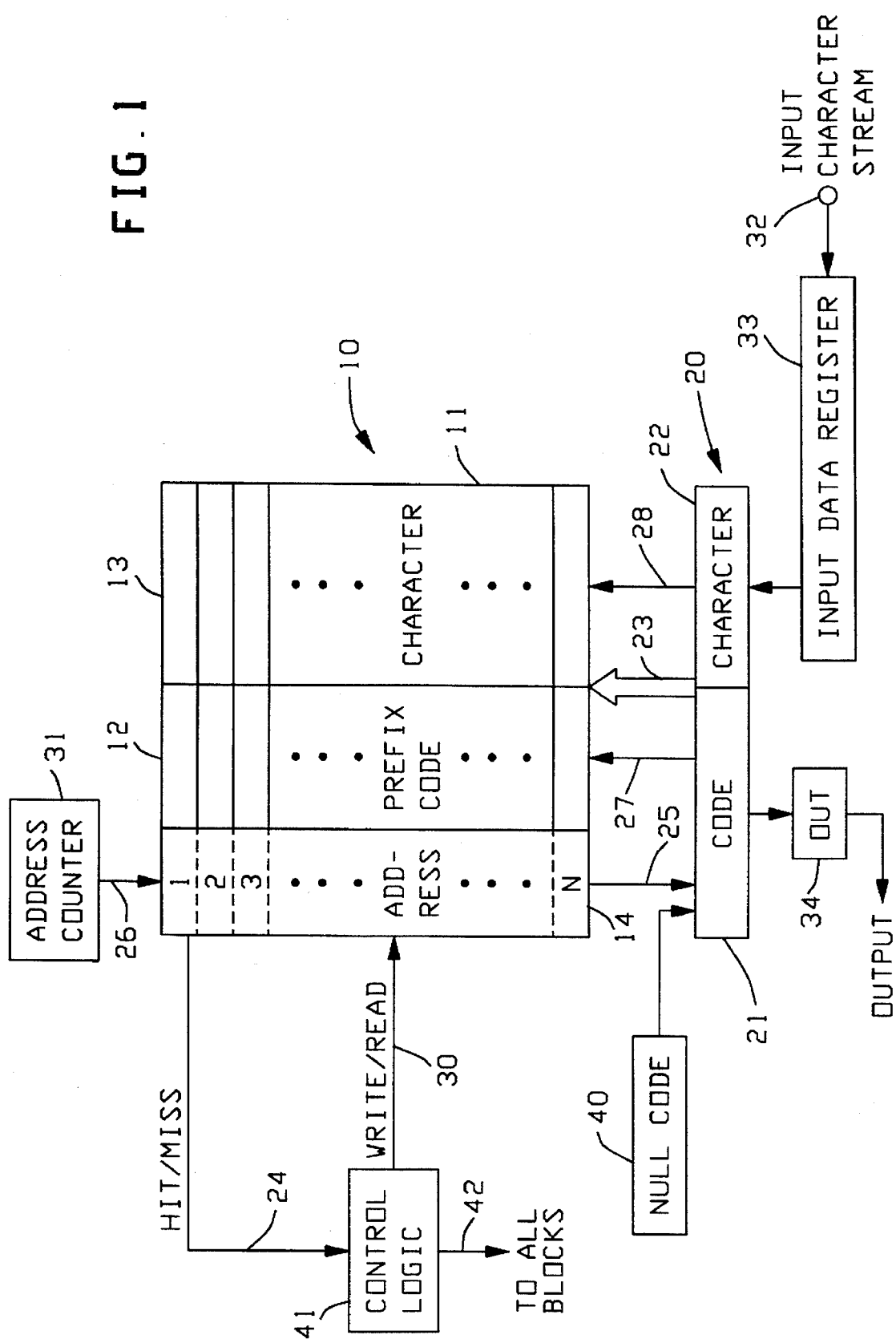

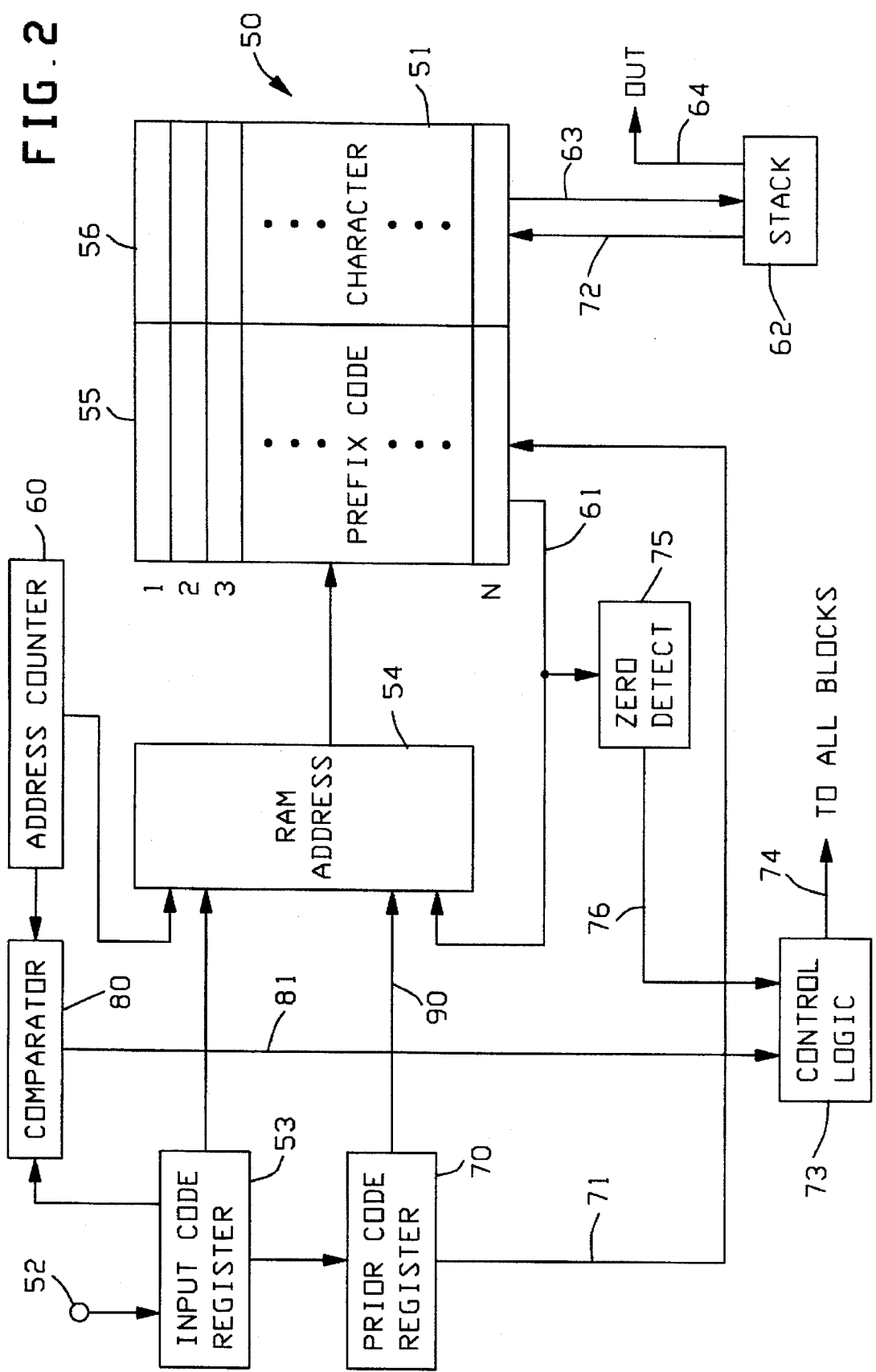

METHOD AND APPARATUS FOR PERFORMING LZW DATA COMPRESSION UTILIZING AN ASSOCIATIVE MEMORY

BACKGROUND OF THE INVENTION

1. Field of the Invention

The invention relates to data compression and decompression.

2. Description of the Prior Art

LZW is a ubiquitously popular process for compressing and decompressing data and is utilized, for example, in such applications as the CCITT V.42 bis standard for modem communication. LZW is described in U.S. Pat. No. 4,558,302, issued Dec. 10, 1985 to Terry A. Welch, entitled "High Speed Data Compression And Decompression Apparatus And Method". Said U.S. Pat. No. 4,558,302 is incorporated herein by reference and is assigned to the assignee of the present invention.

LZW data compression utilizes a dictionary for storing strings of data characters encountered in the input and searching the input stream by comparing the input stream to the strings stored in the dictionary to determine the longest match therewith. The dictionary is augmented by storing an extended string comprising the longest match extended by the next input data character following the longest match. Traditionally, the data compression dictionary is implemented by Random Access Memory (RAM) storage. Welch suggests in said U.S. Pat. No. 4,558,302 (column 52, lines 30—34) that a content-addressable or associative memory might be utilized instead of the RAM which would reduce control complexity. Welch, however, did not describe in any way how this might be accomplished. It is believed that heretofore in the prior art an associative memory embodiment of the LZW compression algorithm has not been provided.

On the other hand, U.S. Pat. No. 4,366,551, issued Dec. 28, 1982 to Klaus E. Holtz, entitled "Associative Memory Search System", discloses a storage and searching system utilizing an associative memory. Said U.S. Pat. No. 4,366,551, however, does not disclose or suggest an associative memory embodiment of the LZW algorithm. Said U.S. Pat. No. 4,366,551 was cited and overcome in a re-examination of said U.S. Pat. No. 4,558,302, under re-examination certificate B 4,558,302, issued Jan. 4, 1994.

SUMMARY OF THE INVENTION

A stream of data character signals is compressed into a stream of compressed code signals by comparing the contents of a register holding a prefix code, character pair to the contents of an associative memory storing prefix code, character pairs. The character portion of the register sequentially holds the data character signals as they are absorbed from the input stream of data character signals. If the comparison results in a Hit, the Hit address is substituted for the prefix code in the register and the next data character signal is substituted for the character in the register. The process is repeated until a Miss occurs, at which time the prefix code in the register is transmitted as the compressed code signal. An address counter provides the address of the next available empty location in the associative memory. The contents of the register is stored at this location and the address counter is incremented.

BRIEF DESCRIPTION OF THE DRAWINGS

FIG. 1 is a schematic block diagram of a data compressor implemented in accordance with the invention.

FIG. 2 is a schematic block diagram of a data decompressor for decompressing the output of FIG. 1.

DESCRIPTION OF THE PREFERRED EMBODIMENTS

Embodiments of the present invention may operate either with dictionaries that are initialized to contain all single character strings or are initialized to contain only the null string. The single character string initialized embodiment will first be described.

Referring to FIG. 1, a data compressor 10, configured in accordance with the present invention, is illustrated. The data compressor 10 includes a content addressable memory 11 having N locations each having a field 12 for storing a prefix code and a field 13 for storing a character. The memory 11 further includes an address section 14 for denoting the addresses of the memory locations.

The compressor 10 compresses a stream of data character signals over an alphabet having [A] characters. For example, in ASCII coded representations, an alphabet size of 256 is utilized. In the single character string initialized embodiment of the data compressor 10, the first [A] locations of the memory 11 are initialized to contain the [A] single character strings. The prefix code in the field 12 of a location storing a single character string is set to zero and the field 13 thereof stores the character in binary form. For example, in ASCII code, the character field 13 is 8 bits wide. The prefix code field 12 contains sufficient bits to accommodate the N locations of the memory 11.

The locations of the memory 11 beginning with location [A]+1 are initialized by resetting all of the character fields 13 thereof to an arbitrary bit pattern that is not recognized as any one of the characters of the alphabet.

The data compressor 10 further includes a register 20 having a field 21 for storing a code and a field 22 for storing a character. The memory 11 operates in an associative or read mode in which the contents of the register 20 is compared to the contents of the memory 11. This operation is denoted by reference numeral 23. If the contents of the register 20 matches the contents of a location in the memory 11, a Hit signal is indicated on a Hit/Miss output 24. The address of the location at which the Hit is found is provided from the address section 14 on an output 25. The output 25 provides an input to the code field 21 of the register 20. If the contents of the register 20 is not found in the memory 11, a Miss is indicated on the output 24.

The memory 11 also operates in a write mode in which the contents of the code field 21 and character field 22 of the register 20 are written into the prefix code field 12 and character field 13, respectively, of the memory 11 at a location addressed by an address input 26. Memory addresses are provided on the address input 26 from an address counter 31. The code, character inputs to the memory 11 in the write mode are indicated by reference numerals 27 and 28, respectively. The write/read mode of the memory 11 is selected by an input 30.

The input data stream of characters to be compressed are applied at an input 32 through an input data register 33 to the character field 22 of the register 20. The compressed code from the data compressor 10 is provided through an output block 34 from the code field 21 of the register 20. A null code input 40 is utilized to zero the code field 21 of the register 20.

Control logic 41 provides inputs to all of the components of the data compressor 10 as indicated at 42. The control logic 41 receives the Hit/Miss signal on the memory output 24 and provides the write/read control to the memory 11 via the memory input 30.

In operation in the single character string initialized embodiment of the data compressor 10, the first [A] locations of the memory 11 are initialized to store all possible single character strings. In these initialized locations, the prefix code fields 12 are set to zero and the character fields 13 are set to the binary representation of the respective characters of the alphabet. The address counter 31 is set to [A]+1. The input character stream to be compressed is supplied at input 32 and buffered in the input data register 33.

A cycle of the data compressor 10 occurs as follows.

The code field 21 of the register 20 is zeroed by null code 40. The character field 22 stores the character that resulted in a Miss indication on the output 24 in the previous cycle. If, however, the data compressor 10 is beginning its first cycle, the first character in the input stream is placed into the character field 22 from the input data register 33.

The control logic 41 controls the memory 11 via the input 30 to operate in the associative mode. The contents of the register 20 is compared to the contents of the memory 11 via the path 23 and if located, a Hit is registered on the output 24 to the control logic 41. The address at which the Hit occurred is loaded into the code field 21 of the register 20 and the next input character is loaded into the character field 22. This procedure repeats until a Miss is registered on the output 24 to the control logic 41. When this occurs, the code resident in the field 21 of the register 20 is provided through the output block 34 as the compressed code output for the cycle.

The control logic 41 then controls the memory 11 to operate in its write mode via the control input 30 to write the code from the input 27 and the character from the input 28 into the prefix code field 12 and the character field 13 of the location addressed by the address counter 31. The address counter 31 is then incremented by one and the code field 21 is zeroed via the null code 40.

The compression cycle is then complete and the data compressor 10 is ready to perform the next cycle.

The control logic 41 provides control signals to all of the blocks of the data compressor 10 to control the operations described above. The control logic 41 may conveniently be implemented by a conventional state machine.

By the above described cycle of operation, an input string of characters in the input stream has been absorbed by the data compressor 10 and compared to the contents of the memory 11 until the longest match with the input is achieved. The compressed code of this longest match is output and the memory is updated by storing an extended string in the memory 11 comprising the longest match extended by the next following character in the input stream.

Thus, the data compressor 10 performs LZW compression without the RAM search overhead normally associated with this type of compression. Instead, the content addressable comparison of the contents of the register 20 with the contents of the memory 11 is performed.

Referring to FIG. 2, a data decompressor 50 for decompressing the compressed code output of the data compressor 10 of FIG. 1 is illustrated. The data decompressor 50 receives the compressed code output from the output block 34 of FIG. 1 and recovers the corresponding stream of data characters. The decompressor 50 utilizes a RAM 51 in a manner similar to that described in said U.S. Pat. No. 4,558,302. The decompressor 50 is structured and operates in a manner similar to FIG. 5 of said U.S. Pat. No. 4,558,302.

The compressed code is received at an input 52 and held in an input code register 53. The input code from the register 53 is applied to a RAM address register 54 to access the RAM 51 at the location represented by the compressed code in the RAM address register 54. Each location of the RAM 51 includes a prefix code field 55 and a character field 56.

In a manner similar to that described above with respect to FIG. 1, the RAM 51 is initialized to contain all of the single character strings. Thus, the first [A] locations of the RAM 51 are initialized so that the prefix code fields 55 thereof store zero and the character fields 56 thereof store the binary representations of the respective characters of the alphabet.

The decompressor 50 also includes an address counter 60 which at initiation of the decompression operation is initialized to [A]+1. The output of the address counter 60 provides an input to the RAM address register 54 for accessing the RAM 51. The RAM 51 contains N locations corresponding to the N locations of the content addressable memory 11 of FIG. 1.

The RAM 51 is operated in a read mode when a string of characters is being recovered and in a write mode when the RAM 51 is being updated. In the read mode, the prefix code in the location accessed by the RAM address register 54 is applied on a path 61 and the character from the accessed location is applied to a pushdown stack 62 via a path 63. The prefix code on the path 61 is applied as an input to the RAM address register 54. The stack 62 is utilized to hold the characters of a recovered string which are sequentially popped out on an output 64.

In the write mode of the RAM 51, the code provided from a prior code register 70 via a path 71 is written into the prefix code field 55 of the location accessed by the RAM address register 54. The stack 62 provides a character via an input 72 to be written into the character field 56 of this accessed location. When a decompression cycle is completed, the code in the input code register 53 is transferred to the prior code register 70.

The decompressor 50 further includes control logic 73 to provide control inputs to all of the components of the decompressor 50 as indicated by reference numeral 74. A zero detector 75 detects when the prefix code output 61 of the RAM 51 is zero and provides this indication to control logic 73 via a path 76.

In order to provide "exception case" processing to be described, the decompressor 50 includes a comparator 80 that compares the code in the input code register 53 with the contents of the address counter 60 and provides an indication to the control logic 73 via a path 81 when these quantities are equal.

In operation, the decompressor 50 performs a decompression cycle for each compressed code received at the input 52 to recover and provide on the output 64 the character string corresponding to the code. Decompression cycles normally occur as follows.

The input code in the register 53 is applied to the RAM address register 54 to access the RAM 51. The control logic 73 controls the RAM 51 to the read mode. The character stored in the accessed location is read onto the output 63 and pushed into the stack 62. The prefix code from the accessed location is read onto the output 61 and applied to the RAM address register 54 to address the next accessed location. This process continues until the zero detector 75 detects that the read prefix code is zero. When this occurs, the string of characters pushed into the stack 62 are popped out in reverse order on the output 64 to provide the recovered string corresponding to the compressed code received at the input 52.

The control logic 73 then controls the RAM 51 to the write mode and writes the contents of the prior code register 70 into the RAM location accessed by the address counter 60. The character at the top of the stack 62 is written into the character field 56 of this accessed location via the stack output 72. The character written into the character field 56 is the first character of the currently recovered string and is the extension character of the extended string being stored.

At the end of the decompression cycle, the address counter 60 is incremented by unity and the code in the input code register 53 is transferred to the prior code register 70. The decompressor 50 is then ready to receive the next code.

In the first cycle of the decompressor 50 the writing operation is not performed since there is no prior code at this time in the prior code register 70. Additionally, the address counter 60 is not incremented during this cycle.

An "exception case" occurs when the compressor of FIG. 1 outputs the code of a string that was stored in the previous compressor cycle. The compressed code received by the decompressor in this case will not be recognized since the decompressor has not, as yet, stored this string. The exception case occurs when the input compressed code received into the register 53 is equal to the contents of the address counter 60.

The exception case processing is then performed as follows. The code in the prior code register 70 is transferred to the RAM address register 54 via a path 90. The stack 62 is of the type described in said U.S. Pat. No. 4,558,302 where the last character popped from the stack still resides in the top stack register. In normal processing this character provides the extension character and is thereafter overwritten when characters are received on the input 63. In the exception case processing this character is pushed into the stack followed by the characters recovered from the code now resident in the RAM address register 54. This string is then popped from the stack 62 to provide the recovered string on the output 64. The address counter 60 now accesses the RAM 51 via the RAM address register 54 and the character now at the top of the stack 62 is written into the character field 56 of the accessed location. The code now in the prior code register 70 is written into the prefix code field 55 thereof. The code in the input code register 53 is then transferred to the prior code register 70 and the address counter 60 is incremented to complete the exception case cycle.

It is appreciated from the foregoing, that in a manner similar to that described in said U.S. Pat. No. 4,558,302, the string is recovered in reverse order from the RAM 51 in response to an input code. The stack 62 is utilized to then reverse the order of the recovered string providing the characters thereof in the correct sequence.

The above described embodiment of the invention was explained in terms of initializing the memory 11 of FIG. 1 and the RAM 51 of FIG. 2 with all of the single character strings. It is appreciated that the invention may also be applied to an embodiment initialized with the null string. In such an embodiment, the entire memories 11 and 51 are cleared and the address counters 31 and 60 begin at a count of unity. Processing occurs in a manner similar to that described above, except that when a character is encountered for the first time it is transmitted uncompressed so that the decompressor can remain in synchronism with the compressor. This may be achieved by the compressor 10 transmitting a zero code followed by the character which can then be recognized and recovered by the decompressor 50. In this embodiment, the zero code is detected at the input code register 53 with a zero detector.

This zero code and character transmission can be accomplished with a path from the character field 22 of the register 20 to the output block 34. The output block 34 would assemble the zero code from the field 21 and the character from the field 22 of the register 20 to provide its output transmission. Additionally, the input code register 53 of FIG. 2 would be modified to provide the single character transmission to the output 64 via the stack 62. The character would be stored in the RAM 51 with a zero prefix code. The address counter 60 would be appropriately incremented to accommodate these differences with respect to the single character string initialized embodiment described above.

The above described embodiments can be implemented in software, firmware, logic, hardware, and the like or combinations thereof.

While the invention has been described in its preferred embodiments, it is to be understood that the words which have been used are words of description rather than of limitation and that changes may be made within the purview of the appended claims without departing from the true scope and spirit of the invention in its broader aspects.

I claim:

1. A data compression/decompression method, said data compression method for compressing an input stream of data character signals into a stream of compressed code signals, said data decompression method for decompressing said stream of compressed code signals to recover said input stream of data character signals corresponding thereto, said data character signals belonging to an alphabet of data character signals containing (A) characters, said data compression method comprising:

(a) utilizing an associative memory having a plurality of locations for storing strings of data character signals, each location having a prefix code field and a character field, each location having an address associated therewith, the address providing a compressed code signal for a stored string, (b) initializing said memory to contain (A) single character strings of said alphabet by nulling the prefix code fields of (A) locations of said memory and inserting the data character signals of said alphabet into the character fields of said (A) locations, respectively, (c) utilizing a register having a code field and a character field, (d) nulling said code field of said register and inserting a data character signal of said input stream into said character field of said register, (e) associatively comparing the contents of said register with the contents of the locations of said memory to determine a match therewith, (f) if a match is determined, inserting the address associated with the matched location into said code field of said register and inserting a next data character signal of said input stream into said character field of said register, (g) repeating steps (e) and (f) until no match is determined, thereby finding the longest stored string in said memory matching said input stream, (h) when no match is determined in step (e), providing the contents of said code field of said register as a compressed code signal, thereby providing the compressed code signal of said longest matched stored string, (i) writing the contents of said code field and said character field of said register into the prefix code field and the character field, respectively, of a next empty location in said memory, thereby inserting into said memory an extended string comprising said longest matched stored string extended by the next following data character signal in said input stream, the address of said next empty location providing the compressed code signal for said extended string inserted into said memory, (j) nulling said code field of said register after inserting said extending string into said memory, and (k) repeating steps (e) through (j) until no further input stream of data character signals is available to be compressed.

2. The method of claim 1 wherein the following steps (o) through (y) comprise a decompression cycle of said data decompression method, said data decompression method comprising:

(l) utilizing a decompression memory having a plurality of locations for storing strings of data character signals, each location having a prefix code field and a character field, each location having an address associated therewith, the address providing a compressed code signal for a string stored in said decompression memory, (m) initializing said decompression memory to contain (A) single character strings of said alphabet by nulling the prefix code fields of (A) locations of said decompression memory and inserting the data character signals of said alphabet into the character fields of said (A) locations, respectively, (n) utilizing an address register for accessing said locations of said decompression memory, (o) receiving a compressed code signal into an input code register, (p) transferring the contents of said input code register to said address register, (q) utilizing a prior code register for holding the compressed code signal received in the decompression cycle preceding a current decompression cycle, (r) accessing the location of said decompression memory corresponding to the contents of said address register, (s) inserting the contents of the character field of the accessed location into a stack, thereby inserting the data character signal in the character field of the accessed location into said stack, (t) inserting the contents of the prefix code field of the accessed location into said address register, (u) repeating steps (r) through (t) until the contents of said address register is null, thereby inserting into said stack the data character signals corresponding to the received compressed code signal, (v) inserting the address of a next empty location into said address register, (w) writing an update prefix code and an update character into the prefix code field and the character field, respectively, of the location of said decompression memory accessed by said address register, the update prefix code being provided by said prior code register, the update character being provided by the last data character signal inserted into said stack, thereby inserting into said decompression memory an extended string corresponding to the extended string inserted into said associative memory, the address of said next empty location providing the compressed code signal for said extended string inserted into said decompression memory, (x) outputting the contents of said stack, thereby recovering the string of data character signals corresponding to the received compressed code signal, (y) transferring the received compressed code signal in said input code register into said prior code register, (z) repeating steps (o) through (y) until no further stream of compressed code signals is available to be decompressed.

3. The method of claim 2 wherein said data decompression method includes an exception processing method invoked when a received compressed code signal does not have a corresponding string stored in said decompression memory, said received compressed code signal thereby being unrecognized, steps (e) through (j) comprise a compression cycle of said data compression method, and said data compression method includes performing a current compression cycle following performing a prior compression cycle, said data compression method providing said unrecognized compressed code signal when the data compression method in the current compression cycle provides the compressed code signal of the extended string inserted into said associative memory in step (i) of the prior compression cycle.

4. The method of claim 3 wherein said exception processing method comprises:

creating an exception extended string comprising the string corresponding to the compressed code signal in said prior code register extended by said update character, outputting said exception extended string, thereby outputting the string corresponding to said unrecognized compressed code signal, and storing said exception extended string in said decompression memory, said unrecognized compressed code signal providing the compressed code signal corresponding to said stored exception extended string.

5. The method of claim 4 wherein said exception processing method comprises:

inserting said update character into said stack, transferring the contents of said prior code register to said address register, performing steps (r) through (x), thereby creating said exception extended string, outputting said exception extended string and storing said exception extended string in said decompression memory with the address of step (v) providing said unrecognized compressed code signal for said exception extended string, and continuing said decompression method with step (y).

6. The method of claim 5 wherein said data decompression method further includes:

utilizing an address counter for assigning sequential addresses for accessing sequential empty locations of said decompression memory, thereby providing the address of said next empty location of step (v), said sequential empty locations beginning with (A)+1, and invoking said exception processing method in accordance with a comparison between a received compressed code signal in said input code register and the contents of said address counter.

7. The method of claim 2 wherein said data decompression method further includes assigning sequential addresses for accessing sequential empty locations of said decompression memory, thereby providing the address of said next empty location of step (v), said sequential empty locations beginning with (A)+1.

8. The method of claim 2 wherein said outputting step comprises outputting the data character signals from said stack in an order reversed from the order in which the data character signals were inserted into said stack.

9. The method of claim 1 wherein said data compression method further includes assigning sequential addresses for accessing sequential empty locations of said memory for providing said next empty location of step (i), said sequential addresses beginning with (A)+1.

10. The method of claim 1 wherein said initializing step further comprises:

inserting into the character fields of the locations of said memory, except for said (A) locations, an arbitrary bit pattern not recognized as one of the data character signals of said alphabet.

11. A data compression/decompression system including data compression apparatus for compressing an input stream of data character signals into a stream of compressed code signals and data decompression apparatus for decompressing said stream of compressed code signals to recover said input stream of data character signals corresponding thereto, said data character signals belonging to an alphabet of data character signals containing (A) characters, said data compression apparatus comprising:

(a) an associative memory having a plurality of locations for storing strings of data character signals, each location having a prefix code field and a character field, each location having an address associated therewith, the address providing a compressed code signal for a stored string, (b) said memory being initialized to contain (A) single character strings of said alphabet by nulling the prefix code fields of (A) locations of said memory and inserting the data character signals of said alphabet into the character fields of said (A) locations, respectively, (c) a register having a code field and a character field, (d) means for nulling said code field of said register and inserting a data character signal of said input stream into said character field of said register, and (e) control means coupled to said memory and said register for operating said memory for associatively comparing the contents of said register with the contents of the locations of said memory to determine a match therewith, (f) said control means being operative, if a match is determined, for causing the address associated with the matched location to be inserted into said code field of said register and for causing a next data character signal of said input stream to be inserted into said character field of said register, (g) said control means being operative to repeat (e) and (f) until no match is determined, thereby finding the longest stored string in said memory matching said input stream, (h) said control means being further operative, when no match is determined in (e), to provide the contents of said code field of said register as a compressed code signal, thereby providing the compressed code signal of said longest matched stored string, (i) said control means further operating said memory for writing the contents of said code field and said character field of said register into the prefix code field and the character field, respectively, of a next empty location in said memory, thereby inserting into said memory an extended string comprising said longest matched stored string extended by the next following data character signal in said input stream, the address of said next empty location providing the compressed code signal for said extended string inserted into said memory, (j) said control means being coupled to said means for nulling and being operative for nulling said code field of said register after inserting said extended string into said memory, (k) said control means being operative to repeat (e) through (j) until no further input stream of data character signals is available to be compressed.

12. The system of claim 11 wherein the following (o) through (y) define a decompression cycle of said data decompression apparatus, said data decompression apparatus comprising:

(l) a decompression memory having a plurality of locations for storing strings of data character signals, each location having a prefix code field and a character field, each location having an address associated therewith, the address providing a compressed code signal for a string stored in said decompression memory, (m) said decompression memory being initialized to contain (A) single character strings of said alphabet by nulling the prefix code fields of (A) locations of said decompression memory and inserting the data character signals of said alphabet into the character fields of said (A) locations, respectively, (n) an address register for accessing said locations of said decompression memory, (o) an input code register for receiving a compressed code signal, (p) means for transferring the contents of said input code register to said address register, (q) a prior code register for holding the compressed code signal received in the decompression cycle preceding a current decompression cycle, (r) a stack, (s) decompression control means coupled to said decompression memory, to said address register, to said input code register, to said prior code register and to said stack for operating said decompression memory for accessing the location of said decompression memory corresponding to the contents of said address register, (t) said decompression control means being operative for causing the contents of the character field of the accessed location to be inserted into said stack, thereby inserting the data character signal in the character field of the accessed location into said stack, (u) said decompression control means being operative for causing the contents of the prefix code field of the accessed location to be inserted into said address register, (v) said decompression control means being operative to repeat (s) through (u) until the contents of said address register is null, thereby inserting into said stack the data character signals corresponding to the received compressed code signal, (w) said decompression control means being further operative to insert the address of a next empty location into said address register and to write an update prefix code and an update character into the prefix code field and the character field, respectively, of the location of said decompression memory accessed by said address register, the update prefix code being provided by said prior code register, the update character being provided by the last data character signal inserted into said stack, thereby inserting into said decompression memory an extended string corresponding to the extended string inserted into said associative memory, the address of said next empty location providing the compressed code signal for said extended string inserted into said decompression memory, (x) said decompression control means being further operative to output the contents of said stack, thereby recovering the string of data character signals corresponding to the received compressed code signal, (y) said decompression control means being further operative to transfer the received compressed code signal in said input code register into said prior code register, (z) said decompression control means being operative to repeat (o) through (y) until no further stream of compressed code signals is available to be decompressed.

13. The system of claim 12 wherein said decompression control means is operative to operate said data decompression apparatus in an exception processing mode invoked when a received compressed code signal does not have a corresponding string stored in said decompression memory, said received compressed code signal thereby being unrecognized, (e) through (j) define a compression cycle of said data compression apparatus, and said data compression apparatus performs a current compression cycle following performing a prior compression cycle, said data compression apparatus providing said unrecognized compressed code signal when said data compression apparatus in the current compression cycle provides the compressed code signal of the extended string inserted into said associative memory in (i) of the prior compression cycle.

14. The system of claim 13 wherein said decompression control means is operative in said exception processing mode to:

create an exception extended string comprising the string corresponding to the compressed code signal in said prior code register extended by said update character, output said exception extended string, thereby outputting the string corresponding to said unrecognized compressed code signal, and store said exception extended string in said decompression memory, said unrecognized compressed code signal providing the compressed code signal corresponding to said stored exception extended string.

15. The system of claim 14 wherein said decompression control means is operative in said exception processing mode to:

insert said update character into said stack, transfer the contents of said prior code register to said address register, perform (s) through (x), to thereby create said exception extended string, output said exception extended string and store said exception extended string in said decompression memory with the address of (w) providing said unrecognized compressed code signal for said exception extended string, and continue the decompression cycle with (y).

16. The system of claim 15 wherein said data decompression apparatus further includes:

an address counter for assigning sequential addresses for accessing sequential empty locations of said decompression memory, thereby providing the address of said next empty location of (w), said sequential empty locations beginning with (A)+I, and means for comparing a received compressed code signal in said input code register with the contents of said address counter, said decompression control means operative to invoke said exception processing mode in accordance with said comparison between said received compressed code signal in said input code register and said contents of said address counter.

17. The system of claim 12 wherein said data decompression apparatus further includes an address counter for assigning sequential addresses for accessing sequential empty locations of said decompression memory, thereby providing the address of said next empty location of (w), said sequential empty locations beginning with (A)+1.

18. The system of claim 12 wherein said decompression control means is further operative to output the data character signals from said stack in an order reversed from the order in which the data character signals were inserted into said stack.

19. The system of claim 11 wherein said data compression apparatus further includes an address counter for assigning sequential addresses for accessing sequential empty locations of said memory for providing said next empty location of (i), said sequential addresses beginning with (A)+1.

20. The system of claim 11 wherein said memory is further initialized by inserting into the character fields of the locations of said memory, except for said (A) locations, an arbitrary bit pattern not recognized as one of the data character signals of said alphabet.

* * * * *